United States Patent
Baas et al.

(10) Patent No.: US 7,113,559 B2
(45) Date of Patent: Sep. 26, 2006

(54) EFFICIENT METHODS FOR FILTERING TO AVOID INTER-SYMBOL INTERFERENCE AND PROCESSING DIGITAL SIGNALS HAVING LARGE FREQUENCY GUARD BANDS

(75) Inventors: Bevan M. Baas, Mountain View, CA (US); Jeffrey M. Gilbert, Sunnyvale, CA (US); William J. McFarland, Los Altos, CA (US); Teresa H. Meng, Portola Valley, CA (US); Ardavan Maleki Tehrani, Los Altos, CA (US)

(73) Assignee: Atheros Communications, Inc., Santa Clara, CA (US)

( * ) Notice: Subject to any disclaimer, the term of this patent is extended or adjusted under 35 U.S.C. 154(b) by 853 days.

(21) Appl. No.: 09/962,842

(22) Filed: Sep. 24, 2001

(65) Prior Publication Data

US 2003/0058975 A1    Mar. 27, 2003

(51) Int. Cl.
*H04B 1/10*    (2006.01)
(52) U.S. Cl. .................. 375/350; 375/229; 375/285; 708/300
(58) Field of Classification Search ............ 375/236, 375/232, 350, 240.2, 254, 260, 346, 347, 375/348, 285, 229; 382/280; 708/300
See application file for complete search history.

(56) References Cited

U.S. PATENT DOCUMENTS

| | | | | |
|---|---|---|---|---|
| 5,233,546 A | * | 8/1993 | Witte | 708/3 |
| 5,627,859 A | * | 5/1997 | Parr | 375/229 |
| 5,970,094 A | * | 10/1999 | Lee | 375/236 |
| 6,356,569 B1 | * | 3/2002 | Sonalkar et al. | 370/545 |
| 6,466,913 B1 | * | 10/2002 | Yasuda et al. | 704/500 |
| 2003/0072464 A1 | * | 4/2003 | Kates | 381/312 |
| 2003/0081804 A1 | * | 5/2003 | Kates | 381/316 |

FOREIGN PATENT DOCUMENTS

| | | | |
|---|---|---|---|
| EP | 1 065 855 | | 1/2001 |
| WO | WO 00/36801 | * | 6/2000 |
| WO | WO 00/38387 | | 6/2000 |
| WO | WO 01/10046 | | 2/2001 |

* cited by examiner

*Primary Examiner*—Jean B. Corrielus
(74) *Attorney, Agent, or Firm*—Bever, Hoffman & Harms, LLP; Jeanette S. Harms

(57) ABSTRACT

A circular filtering system that prevents the problem of inter-symbol interference. The circular filtering system utilizes a buffer memory to store samples of a given symbol and provide only these samples to a linear filter such that the output of the filter, for any given symbol is formed by filtering only samples of that input symbol. Each symbol being filtered independent of other symbols hence eliminating inter-symbol interference caused by filtering. Where symbols are tolerant to a fixed phase shift for each symbol, the circular filtering system can be simplified by reducing the size of the buffer and introducing a multiplexer.

52 Claims, 16 Drawing Sheets

EFFICIENT METHODS FOR FILTERING TO AVOID INTER-SYMBOL INTERFERENCE AND PROCESSING DIGITAL SIGNALS HAVING LARGE FREQUENCY GUARD BANDS

BACKGROUND

1. Field of the Invention

The invention relates generally to digital signal processing. More specifically, the invention relates to processing digital signals that are made up of concatenated sub-sequences.

2. Related Art

In systems that perform digital signal processing, there are classes of these systems which perform signal composition and decomposition. In the case of signal composition, digital signals are being synthesized from a set of data or from analog signals. In the case of signal decomposition, digital signals are often received by a system so that they can be interpreted, analyzed, or merely detected. For instance, a transmitter may digitally model a set of data into digital signals. Then, a receiver, would estimate the contents of the original set of data by analyzing the digital signals that are received.

Certain signals that are at or near a zero frequency (i.e. DC) are called "baseband" signals. FIG. 1 shows one such baseband signal 100 centered around a frequency of zero. Baseband signal 100 has an upper limit in frequency $f_{signal-max}$ at which the signal level drops to zero in amplitude and has no level higher than that at higher frequencies. A discrete-time signal has an infinite number of "images" centered around higher frequencies which are multiples of a sampling frequency $f_{sampling}$. The baseband signal 100 has images 110, 120 and 130 that occur at discrete multiples of $f_{sampling}$ which are $1*f_{sampling}$, $2*f_{sampling}$, and $3*f_{sampling}$, etc., correspondingly, since the baseband spectrum is centered around a frequency of zero. There are other images at higher multiples, that are not shown.

The digital signal (composed of baseband signal 100 and its images 110, 120 and 130) shown in FIG. 1 is a signal that does not exhibit a condition known as "aliasing". Aliasing occurs when a baseband signal is processed (for instance, up-sampled) such that images overlap one another in their frequency spectrums. If the sampling frequency at which a baseband signal were up-sampled were low enough, then images might overlap partially or even entirely. Referring to FIG. 1, if $f_{sampling}$ were less than $2*f_{signal-max}$, and assuming the baseband signal 100 is symmetric about zero frequency (amplitude axis), then the trailing edge of image 110 would overlap with the baseband signal 100. The signal would then be aliased, and thus corrupted such that the original signal could not easily, if at all, be recovered (since the original content of the baseband is a priori unknown in most cases). One way of preventing aliasing is to choose a high enough sampling frequency which can make aliasing impossible. Signals that exhibit no aliasing, such as that shown in FIG. 1, have "guard bands" between the leading edge of one signal image and trailing edge of the next signal image. For instance, between baseband signal 100 and image 110, there is a guard band between them of:

guard band=$f_{sampling}-2*f_{signal-max}$.

Signals and systems that have a large (relative to the total spectrum size of the baseband signal) guard bands are often used in applications where the prevention of aliasing is crucial. FIG. 2(a) is an example of a digital signal with a larger guard band. Baseband signal 200 is shown having images at multiples of a sampling frequency $f'_{sampling}$ that is much larger than $f_{sampling}$ shown in FIG. 1. Such signals with large frequency guard bands are used in systems that may involve many other signal processing steps. The size of the guard band can often simplify these other steps. For instance, systems which convert digital (or discrete-time) signals into analog signals (continuous time) would have to deal with images of the signal. If there were large guard bands, it would be easier to deal with such images (since there is more room between images).

In the time-domain, such signals shown in the frequency domain as waveforms may actually be composed of or encode "symbols". When analyzed as symbols in the time-domain, "inter-symbol interference"(ISI), aliasing becomes a major issue. ISI is interference between two or more symbols contained within a given signal. For example, if a digital signal x(n) is composed of a series of N-length concatenated sub-sequences (i.e. symbols) $x_i(n)$, then $x(n)=\{x_0(0), x_0(1), \ldots, x_0(N-1), x_1(0), x_1(1), \ldots, x_1(N-1), \ldots\}$.

In this example, ISI involves interference between a symbol $x_0$ and the next symbol $x_1$. In this example, ISI is caused by the use of linear filters that operate to output one result for every cycle. Such linear filters have a designated number of taps, M, each of which serve to multiply a provided input by a filter coefficient and sum all such results over the M taps. Linear filters achieve this by well-known sample-and-hold or delay mechanisms which have the effect of pipelining inputs so that they are eventually multiplied by every one of the M taps.

FIG. 2(b) depicts a conventional M-tap linear filter. Initially, the M-tap filter 240 pictured takes M−1 samples of a previous input symbol and the first sample of the current symbol to produce the first sample for the output of the current symbol. Likewise, the second output sample is produced by the M-tap filter 240 filtering the last M−2 samples of the previous symbol and the first two samples of the current symbol. Thus, each symbol contributes samples to the processing of the next symbol, and thus interferes with the next symbol. Once M samples are processed, then the filter 240 takes the current sample of the same symbol and the M−1 samples of the same symbol in order to generate succeeding output samples.

Because of the sequential nature of these filters, a given output is often a filtered version of samples of one symbol and the next. For instance, consider the case of $x_i$ above, where N=10. Each symbol $x_0$, $x_1$ etc. would be composed of 10 samples. If the number of taps M in the filter is 6 (often, the number of taps is less than or equal to the number of samples that need processing, depending on the application), then when the first sample of symbol $x_1(0)$ is input to the filter, the last 5 samples $x_0(5) \ldots x_0(9)$ of the previous symbol $x_0$ will be residual inputs remaining in the filter therewith. The first output of the linear filter for the first sample $x_1(0)$ of symbol $x_1$ is thus corrupted and exhibits ISI (between x(1) and the sequentially preceding symbol x(0)).

This effect is further illustrated in FIG. 3(a). The input is comprised of three concatenated symbols, indexed as i−1, i, and i+1. The next two rows depict the filtered versions of symbols i−1 and i, respectively. The spreading out at the ends of each symbol into the area of adjacent symbols is caused by filtering. The final row shows the area of overlap between the pair of symbols i−1 and i, which represents where ISI occurs. FIG. 3(b) shows a simulation of the example depicted in FIG. 3(a). The input 310 consists of three concatenated symbols each of which is composed of two cycles of a sinusoid, but of differing phase. The filter (not shown) applied upon the input 310 is a low-pass filter with a cutoff frequency above the frequency of the sinusoid. Ordinarily, the waveforms should be unchanged in such a case. However, as depicted in FIG. 3(b) the output 320 which results from such filtering of the input 310, the output 320 shows distortion at the symbol boundaries. This is a result of ISI.

The conventional techniques for generating and detecting signals with large frequency guard bands often have the effect of also causing ISI, since these techniques were intended for use in signals that do not have sub-sequences of symbols contained within them. For instance, one technique for generating the signal 20 shown in FIG. 2(a) involves up-sampling the baseband signal 200 by two using the well-known zero insertion process. After up-sampling, the resulting up-sampled signal is then filtered using a digital lowpass filter 400 such as that shown in FIG. 4. In the frequency domain (shown), the sharp response (i.e. short transition region) of the low-pass filter 400 implies it will exhibit a very long impulse response in the time domain. In digital systems, this long impulse response will cause ISI (because neighboring symbols are corrupted by the length of the response).

Other techniques have sought to convert the digital signal into an analog signal and then perform filtering using an analog filter. After analog filtering the filtered signals may be converted back, at say a receiver, to digital. However, analog low-pass filters have a similarly long impulse response and thus, subject the signal to ISI which is exhibited when the signal reverts to digital form.

For some systems, the digital synthesis/analysis is performed by the well-known Discrete Fourier Transform (DFT) and/or an Inverse Discrete Fourier Transform (IDFT) calculation. The DFT is often implemented by a special transform, which is efficient to implement in digital systems, known as the Fast Fourier Transform (FFT). In these cases, the conventional length N of the FFT is the channel-width (frequency spectrum width) divided by the sub-carrier spacing. For example, one emerging standard in wireless multi-channel communications systems, IEEE (The Institute of Electrical and Electronic Engineers) 802.11a, the channel width is 20 MHz (MegaHertz) and the subcarrier spacing is 312.5 KHz (KiloHertz) which results in an FFT length of $N=(20*10^6/312.50*10^3)=64$. FIG. 5 shows a spectrum of a typical multi-channel communications medium with 20 MHz channels. The IEEE 802.11a standard specifies that each 20 MHz channel has 52 sub-carriers covering 16.5 MHz of the 20 MHz, leaving 3.5 MHz to be used for preventing interference between channels. The FFT length is chosen conventionally to be 64-point for architecture and implementation efficiency, even though only 52 would be needed. For the synthesis (transmitter) case, the signal that results from a 64-point FFT is the same as that shown in FIG. 1. For the analysis (receiver) case, the input to the FFT has the same spectrum as shown in FIG. 1. Both cases require difficult filtering to increase their guard bands and prevent time-domain exhibited ISI.

FIG. 6 illustrates the filtering of an input symbol stream using conventional linear filtering. An input symbol stream is decomposed into a number of groups (symbols) of samples of a fixed length N, where N is the number of samples per symbol. To decode the first sample of a current symbol 620, which is indexed by variable "i", the first sample of the current symbol 620 is passed to an M-tap linear filter 640. The M-tap filter 640 also holds in its taps the last M−1 samples of the previous symbol. The resulting decoded output sample 660 of the decoded symbol 650 (labeled i') will be the filtered result from part of the current symbol 620 (i) and a portion of the previous symbol 610 (i−1). Since the output of the current symbol's samples may be based in part on the input from a prior symbol, the intersymbol interference will contribute to an inaccurate result such that the output 660 may not be as predicted by the filter response. While additional techniques have been used to remove such interference after filtering, few fail to address the interference itself.

Thus, there is a need for methods that process digital signals that have large frequency guard bands but do so without much ISI.

SUMMARY

In one or more embodiments of the invention, a circular filtering system is disclosed which prevents the problem of inter-symbol interference. In one embodiment, the circular filtering system utilizes a buffer memory to store samples of a given symbol and provide only these samples to a linear filter such that the output of the filter, for any given symbol is formed by filtering only samples of that input symbol. Each symbol is filtered independent of other symbols hence eliminating inter-symbol interference caused by filtering. Where symbols are tolerant to a fixed phase shift for each symbol, such as in Orthogonal Frequency Division Multiplexing modulated systems, in another embodiment, the circular filtering system can be simplified by reducing the size of the buffer and introducing a multiplexer. In another aspect of the invention, the conventional length of an FFT is increased beyond what would be ordinarily required in order to produce a larger guard band.

DETAILED DESCRIPTION OF THE INVENTION

In brief, the invention consists of using circular filtering techniques to prevent ISI in digital samples that encode symbols. Such circular filters can be implemented by, in one embodiment, the use of a buffer memory that buffers all the samples of a given symbol and provides selected outputs therefrom to a linear filter. Depending on the nature and origin of the digital samples encoded, it may be possible to use a buffer memory of a smaller size (one that stored less than all the samples of the symbol at any one time) and a multiplexer to selectively provide outputs to the digital filter. In both embodiments, the selection of which samples are provided to the filter is a function of the characteristics of the filter. In another aspect of the invention, the conventional length of an FFT is increased beyond what would be ordinarily required in order to produce a larger guard band.

Figure 7:
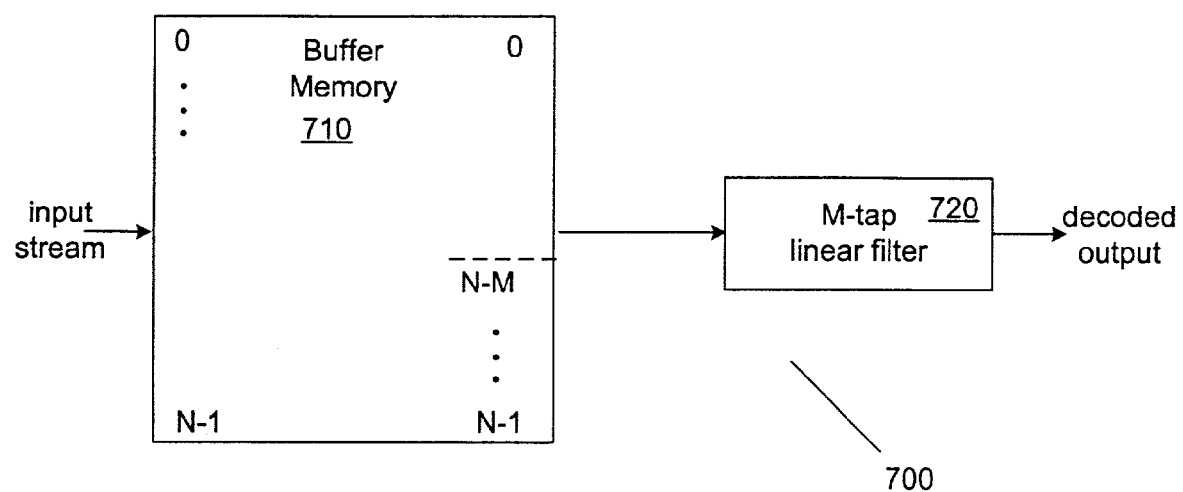
FIG. 7 is an overview of a circular filtering technique according to at least one embodiment of the invention.

FIG. 7 is an overview of a circular filtering technique according to at least one embodiment of the invention. The circular filtering technique of the invention utilizes only samples of the symbol being decoded in filtering and thus, mitigates the problem of inter-symbol interference. An input stream of N samples (indexed from 0 to N−1) are provided to fill the banks of a buffer memory 710. The buffer memory 710 outputs the last M−1 samples of the buffered input and sends these M−1 samples (indexed from N−M to N−1) to an M-tap filter 720. The M-tap filter has a memory of M values which is implemented by a daisy chain sequence of delay elements (i.e. taps). Thus, inputs to the filter 720 in one cycle are pushed through the filter taps in sequence. The M-tap filter 720 provides a decoded output which is a function of the first sample of the current input symbol and the M−1 last samples of the same symbol. Similarly, the filter provides a filtered output which is a function of the first two samples of the current input symbol and the M−2 last samples of the same symbol and so on until the Mth input sample, after which and until the last (N−1) sample, the input sample and the previous M−1 samples in the same symbol are filtered to provide the output sample. To do so, the buffer memory 710, as shown in FIG. 7, should be capable of holding at least N samples of input data (which comprise an entire symbol). The M-tap filter 720 begins to receive samples of the symbol when sample N−M arrives in buffer memory 710. The samples N−M through N−1 are sent to the filter followed by the stored first sample 0. The circular filtering system while reducing inter-symbol interference, however, also introduces a latency of N samples, as discussed in FIG. 8(b) below.

Figure 8A:
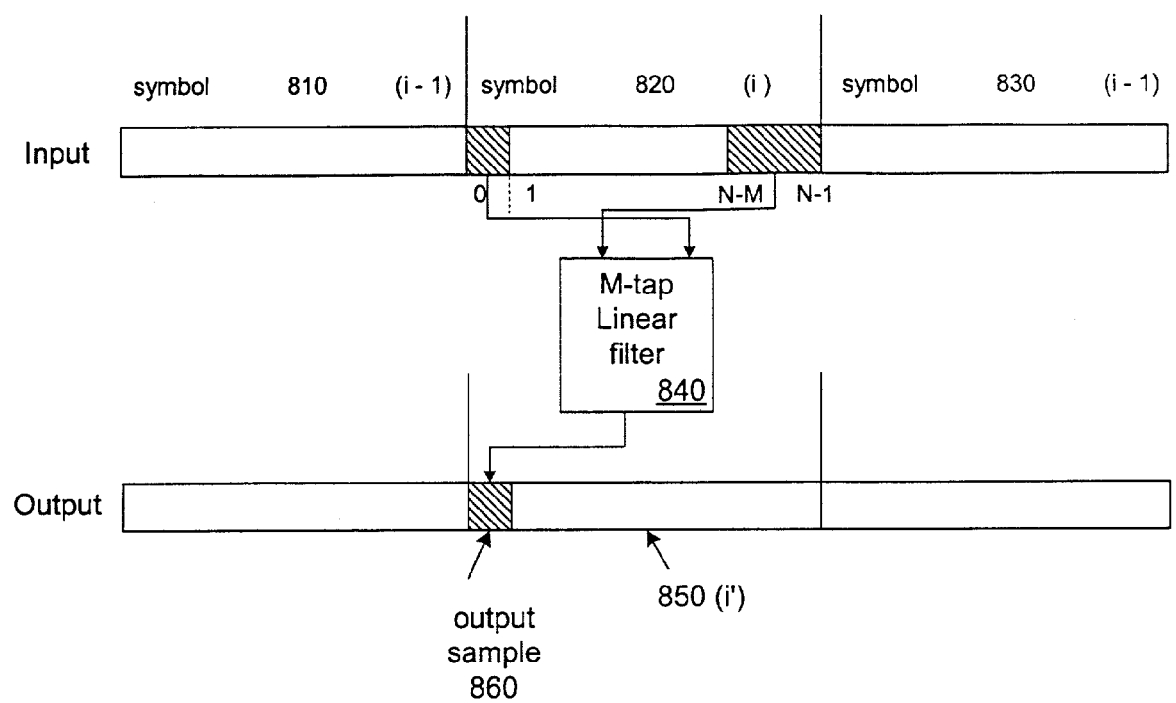
FIG. 8(a) illustrates the filtering of an input symbol stream using circular filtering according to at least one embodiment of the invention.

FIG. 8(a) illustrates the filtering of an input symbol stream using circular filtering according to at least one embodiment of the invention. An input symbol stream is decomposed into a number of groups (symbols) of samples of a fixed length N, where N is the number of samples per symbol. To decode the first sample of a current symbol 820, which is indexed by variable "i", the first sample of the current symbol 820 is passed to an M-tap linear filter 840. The M-tap filter 840 is also sent the last M−1 samples of the same symbol (indexed from N−M to N−1). The resulting output sample 860 of the output symbol 850 (labeled i') will be the filtered result from only samples of the current symbol 820 (i) with no contribution from either symbols 810 or 830. Before observing the output sample 860, however, a latency equal to the time of N samples being written to a buffer, must be borne. FIG. 8(a) does not intend to show the timing of the inputs and outputs, merely, which samples contribute to which outputs. In this case, since the output 860 is a function of only samples of symbol 820, there is no inter-symbol interference.

In general, if R is less than M, the Rth output sample will be a function of the last M−R samples of a symbol and the first R samples of the same symbol. Once R becomes greater than or equal to M, the Rth output sample would become a function of the prior M−1 input samples and the Rth input sample. Since the N samples of a given symbol are indexed from 0 to N−1, with the first sample being indexed "0", in terms of index, if the output sample index n is less than M, then the output sample n (where n is from 0 to N−1), is the filtered result of input sample(s) indexed from 0 to n, and the sample(s) indexed from N−M+n to N−1. When n=M−1 and thereafter for the same symbol, the output sample n is merely the filtered result of samples indexed from n−M+1 to n.

Figure 8B:
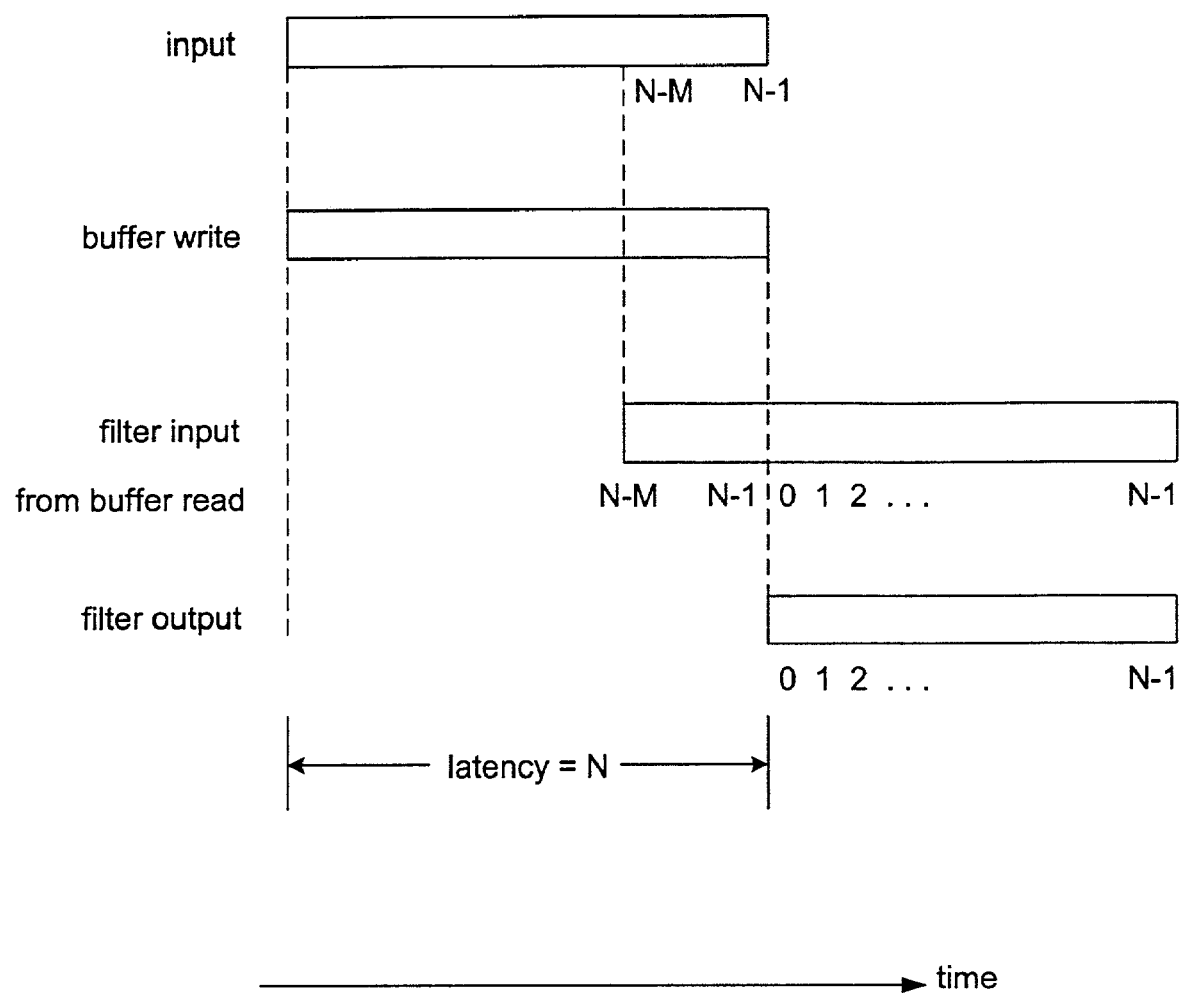
FIG. 8(b) illustrates a timing diagram of the filtering of an input symbol stream using circular filtering according to at least one embodiment of the invention.

FIG. 8(b) illustrates a timing diagram of the filtering of an input symbol stream using circular filtering according to at least one embodiment of the invention. The timing diagram better depicts the order of operations in the circular filtering methodology. The input of N samples labeled from 0 to N−1 are written to the buffer memory in a buffer write procedure. During that time, after the first N−M−1 samples are written to the buffer in the buffer write procedure, starting with the time when sample N−M is written to the buffer, a buffer read is initiated which continues until the last sample N−1 arrives in the buffer. The buffer read forms the input to the filter, and after sample N−1 is input to the filter, the buffer read begins at the beginning of the buffer, reading sample zero therefrom. At this point, a latency equal to the time for N samples to be written to the buffer, has passed, and the first output sample zero can be output from the filter. From this point on, the buffer read continues to read the next sample (i.e. one) and sends it to the filter which already has sample zero followed by the last M=2 samples. This continues until all N samples have passed through the filter which produces the filter output.

For some applications, such as signals subject to Orthogonal Frequency Division Multiplexing (OFDM) modulation, the symbols contained within are tolerant to having their spectrum multiplied by a fixed phase profile. In other words, if the Discrete Fourier Transform (which can model the effect of a linear filter upon a signal) of the ith sub-sequence (symbol) of length N is Xi(k), where k is the number of the sample within the sub-sequence, and if X'i(k)=Xi(k)*D(k), where X'i(k) is a phase-modified version of the transformed signal, then the system will still perform substantially the same as long as the phase of D(k) remains constant over all symbols for all k (from 0 to N−1) and the absolute value of D(k) over all symbols is one for all k (from 0 to N−1). The phase of D(k) can be arbitrary, but should be the same for all symbols. Such signals are said to be tolerant to a fixed phase modification.

The special fixed phase profile to which the symbols are subjected is caused by a fixed shift (actually a rotation of the sequence which is a shift of the periodic extension of the sequence) "d" in the time domain. If X(k) is the Fourier transform of x(n), then the Discrete Fourier transform of x(n) rotated in time by d, or x(n−d) is:

$$e^{-j(2\pi*k/N)*d}*X(k).$$

The magnitude of the spectrum is unchanged, only its phase is modified, and hence a time shift of a signal meets the above described criterion for operations to which OFDM signals are tolerant.

For such signals, the size of the buffer memory can be reduced. Instead of using a buffer memory capable of holding N samples, a buffer memory capable of holding M (the number of taps or length of the filter) samples is all that is required. Since the additional N−M samples are not required to be stored in the buffer memory, the latency of decoded outputs from the filter is always reduced by N−M cycles. Thus, OFDM signals, which are tolerant to a fixed phase shift, can take advantage of such optimization in circular filtering.

Figure 9A:
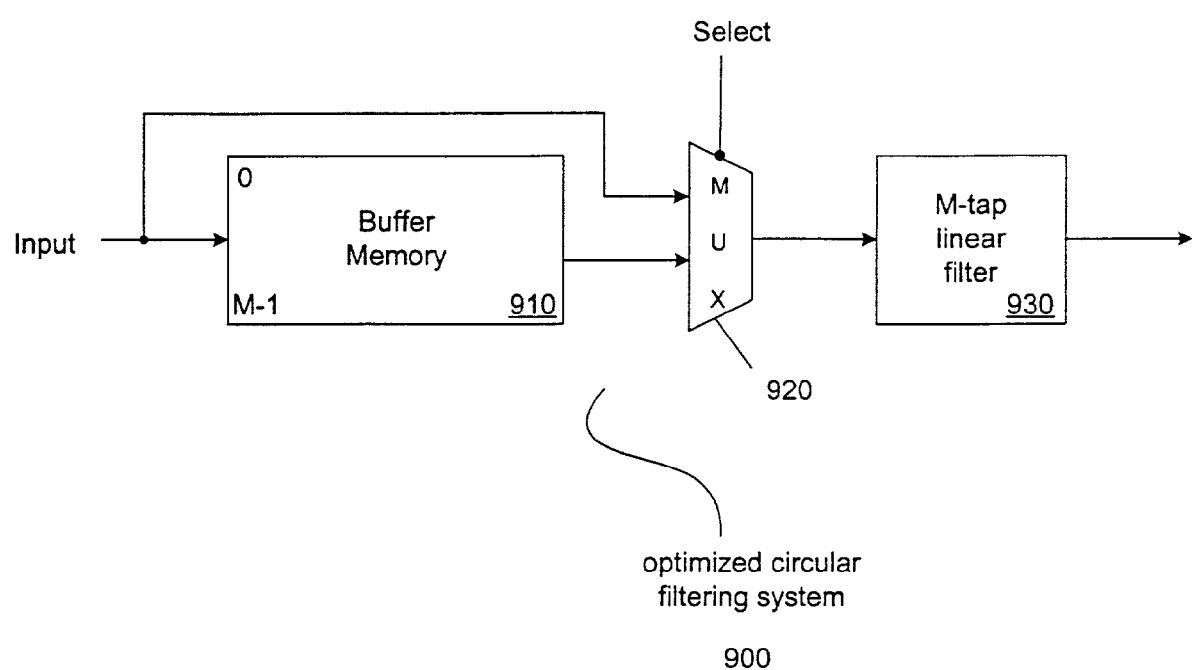
FIG. 9(a) is an overview of a circular filtering technique which is optimized to reduce the required buffer sizes for symbols that are tolerant to a fixed phase shift according to at least one embodiment of the invention.

FIG. 9(a) illustrates an optimized circular filtering technique that can be employed for OFDM modulated signals according to one or more embodiments of the invention. As mentioned above, since OFDM modulated signals are tolerant to a fixed phase shift, the filtering can occur as soon as enough samples are buffered to fit the size of the filter (i.e. the number of taps of the filter). Thereafter, each succeeding sample can be passed to the filter without the need to wait for buffering. When all samples of the current symbol have been processed in this manner, buffering begins again for the next succeeding symbol, and a wait is introduced until M samples are available for filtering.

The depicted optimized circular filtering system 900 operates essentially as described above. A buffer memory 910 is capable of holding M samples (indexed from 0 to M−1) of an input stream. At the start of each new symbol, the buffer memory 910 would proceed to overwrite the M samples present from the previous symbol. Each of the samples comprising the input stream is sent to the buffer memory 910 and separately to a MUX 920. MUX 920 is a two-to-one multiplexer which selects either the output from the buffer memory 910 or the currently streamed input sample. The first M samples are both written to the buffer memory 910 and sent to the filter via MUX 920. MUX 920 continues to select inputs for the filter from the input stream throughout all N samples of the symbol. At that point, the MUX 920 selects for filter 930's input from the buffer memory 910 output, which dumps out the first M samples of the symbol.

In general, the Rth output sample will be a function of the last M−R samples of a symbol and the first R samples of the same symbol. Once R becomes greater than or equal to M, the Rth output sample would become a function of the prior M−1 samples and the Rth input sample. Since the N samples of a given symbol are indexed from 0 to N−1, with the first sample being indexed "0", in terms of index, if the output sample index n is less than M, then the output sample n (where n is from 0 to N−1), is the filtered result of input sample(s) indexed from 0 to n, and the sample(s) indexed from N−M+n to N−1. When n=M−1 and thereafter for the same symbol, the output sample n is merely the filtered result of samples indexed from n−M+1 to n.

Figure 9B:
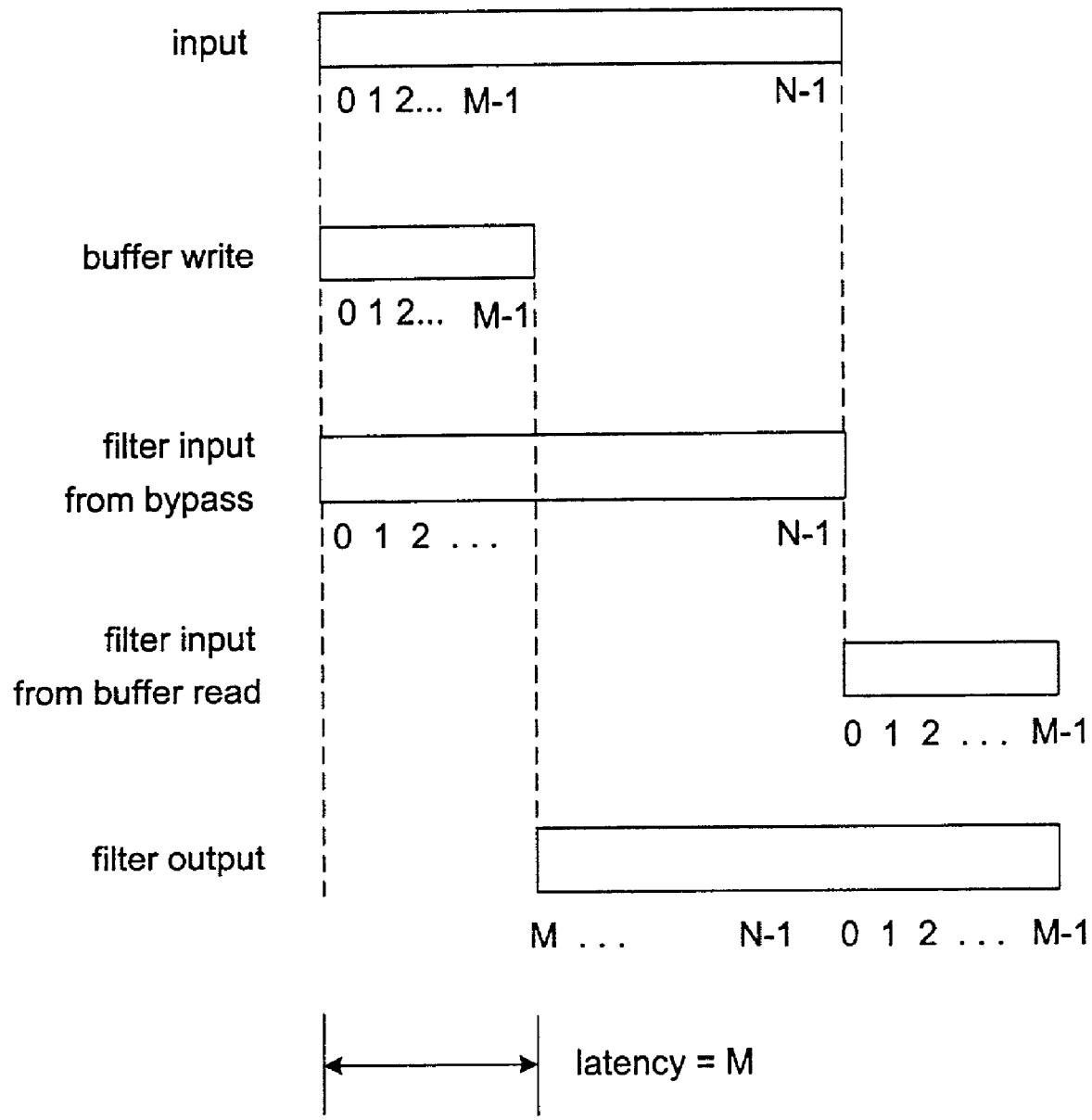
FIG. 9(b) is a timing diagram of a circular filtering technique which is optimized to reduce the required buffer sizes for symbols that are tolerant to a fixed phase shift according to at least one embodiment of the invention.

FIG. 9(b) is a timing diagram of a circular filtering technique which is optimized to reduce the required buffer sizes for symbols that are tolerant to a fixed phase shift according to at least one embodiment of the invention. The timing diagram better depicts the order of operations in the optimized circular filtering methodology. The input of N samples indexed from 0 to N−1 is streamed into the system. While being streamed in, the first M samples indexed from 0 to M−1 are written to the buffer memory in a buffer write procedure. During the streaming of the N samples, the filter receives inputs from the bypass (i.e. by selection through the multiplexer). After the first M samples are written to the buffer in the buffer write procedure, starting with time when sample M is streamed through the bypass to the filter input, outputs are observed from the filter. The buffer read forms the input to the filter and the bypass from streamed samples ceases after all N samples are streamed in. At this point, the filter input from a buffer read would start from sample 0 through sample M−1. When the filter input of sample zero from the buffer read is concatenated with M−1 samples already in the filter, the result is an output sample zero from the filter which is a function of samples 0 and samples N−M to samples N−1 of the same symbol. From this point on, the buffer read continues to read the next sample (i.e. one) and sends it to the filter which already has sample zero followed by the last M=2 samples. This continues until all M samples from the buffer read are input to the filter.

The outputs observed at the filter are absent of inter-symbol interference. The output sample M is a function of the filter operating on inputs 0 to M−1. The output sample M+1 is a function of the filter operating on inputs 1 to M, and so forth. The tolerance to a fixed phase shift allows these samples to be observed first and still preserve the proper symbol magnitude or level. As shown, the output samples corresponding to inputs from 0 to M−1 arrive out of order, after the output samples corresponding to input samples M to N−1 arrive from the filter output. Thus, the outputs of the filter are time shifted, which is one way of producing a fixed phase shift. If the symbols are tolerant to such a shift, an advantage in reduced hardware and improved latency can be gained while performance/accuracy is maintained.

Figure 10:
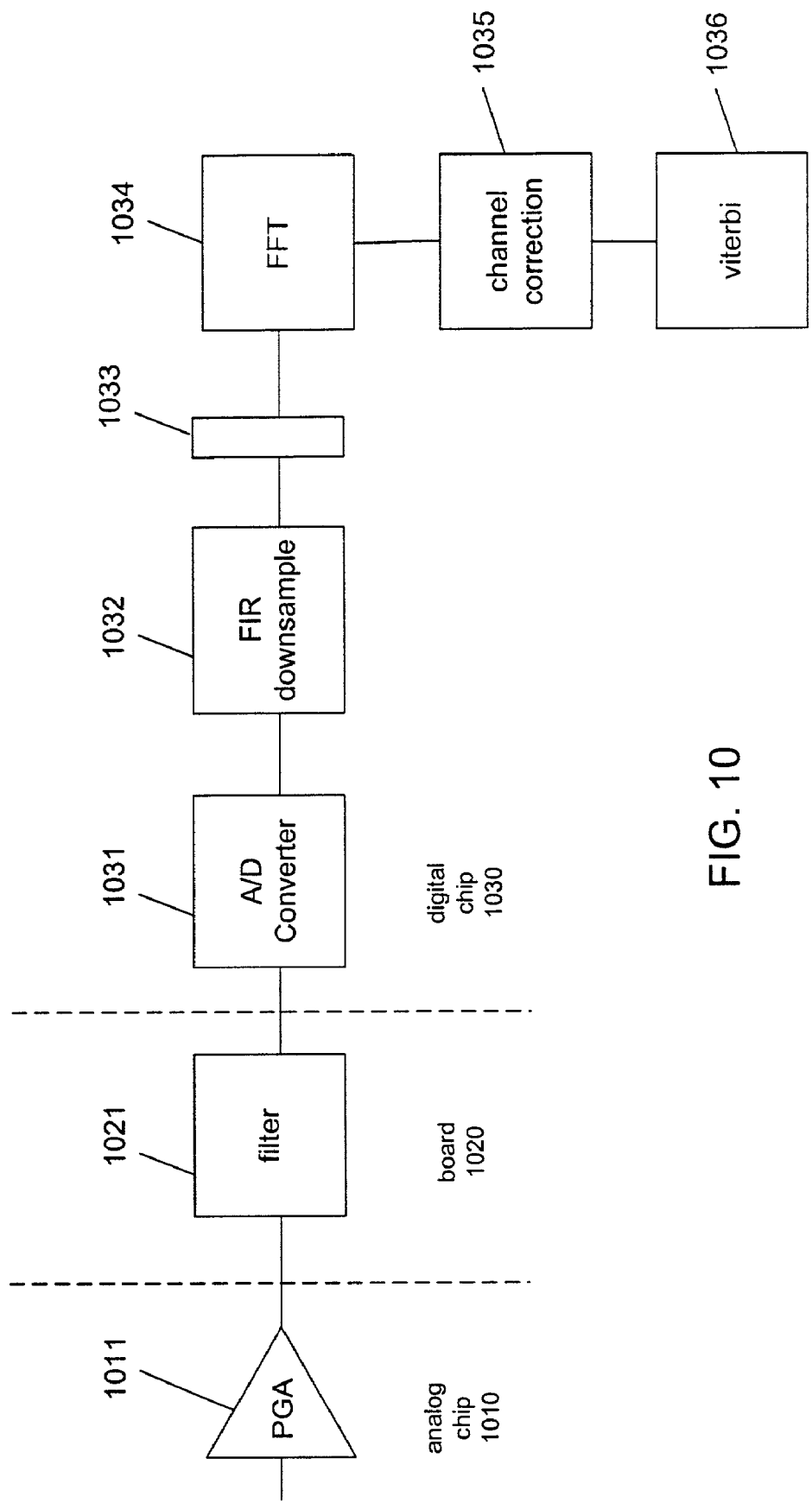
FIG. 10 illustrates the principal blocks in the receive path of an OFDM receiver employing one or more embodiments of the invention.

FIG. 10 illustrates the principal blocks in the receive path of an OFDM receiver employing one or more embodiments of the invention. Assuming transmission over a wireless network, the radio signal in receiver 1000 would be picked up by an antenna (not shown) and sent to the analog chip 1010 which includes an PGA (Programmable Gain Amplifier) 1011 which amplifies the received signal. The filter 1021, which is on the board 1020 which houses chip 1010, removes out-of-band signals and sends the output to a baseband digital processing chip 1030. Immediately after coming on-chip (chip 1030), the analog signal is converted to a digital format by the Analog-to-Digital Converter (ADC) 1031. The signal is then low-pass filtered and down-sampled by Finite Impulse Response Filter (FIR) 1032. Low-pass filtering is required to greatly attenuate all signals that will alias into the signal band upon down-sampling. This filtering can be done using either conventional linear filtering, or in accordance with the invention, through circular filtering and/or optimized circular filtering discussed above. Block 1033 applies various corrections to the signal, such as DC offset removal and frequency correction. A Fast Fourier Transform (FFT) processor 1034 converts the time domain waveform to frequency domain signals. A channel correction block 1035 applies magnitude and phase corrections to the transformed signal appropriate for the current transmitter-to-receiver channel. A viterbi block 1036 decodes the data bits and sends them to the MAC layer for processing.

The level of inter-symbol interference affects the decoded symbol as and thus, the data that is resolved in the various receiver blocks. By utilizing circular filtering in the filter 1032, inter-symbol interference can be reduced yielding increased range and reduced error rates in data decoding. Further, if an optimized circular filtering is used, as might be in the case of OFDM, then the filter's complexity will be reduced, resulting in lower costs and lower power dissipation. Latency will also be reduced, yielding less latency through the receiver as a whole, which implies an increase in system throughput since the time between a signal being received and interpreted is reduced.

Figure 11:
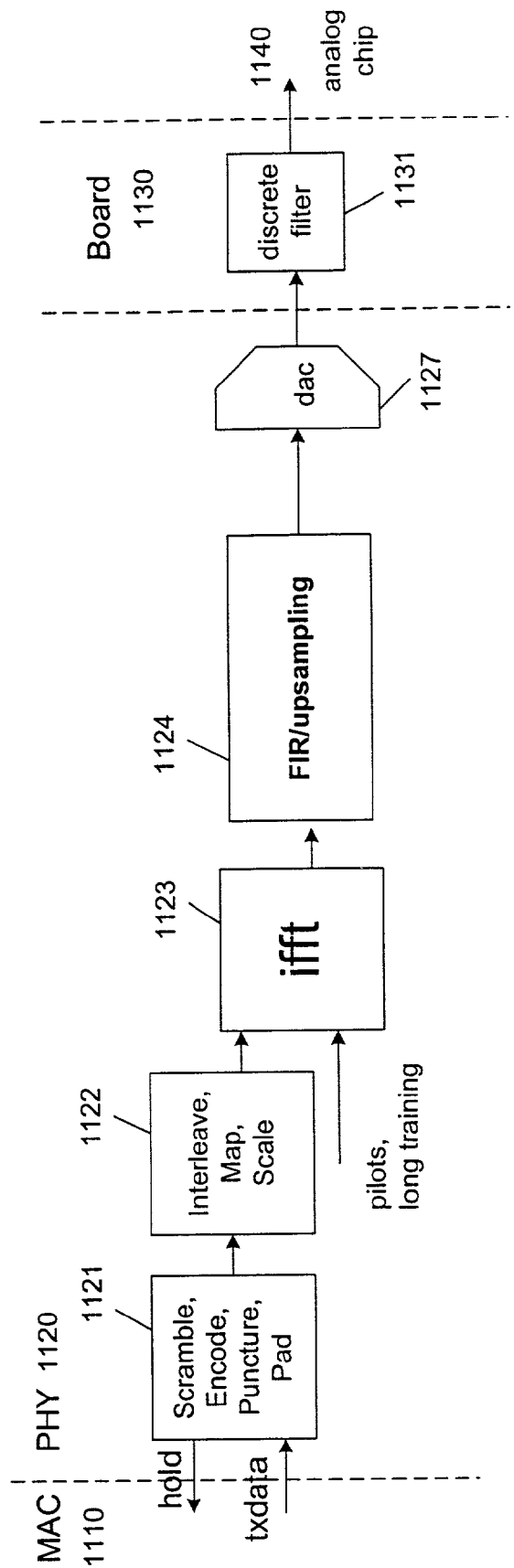
FIG. 11 illustrates the principal blocks in the receive path of an OFDM receiver employing one or more embodiments of the invention.

FIG. 11 illustrates the principal blocks in the transmit path of an OFDM transmitter employing one or more embodiments of the invention. Medium Access Controller (MAC) layer 1110 interfaces between higher levels in the network (according to the Open Systems Interconnect (OSI) layer model) and the Physical (PHY) layer 1020. The PHY layer 1120 is the lowest level in the OSI model and includes digital baseband, analog baseband, and radio frequency (RF) portions. During transmission, data flowing from the MAC is scrambled, encoded, punctured, and padded by the block 1121. The block 1122 interleaves data across symbols, maps bits to various magnitudes and phases (depending upon the current modulation), and scales results for the Inverse Fast Fourier Transform processor (IFFT) 1123. During the course of transmitting a packet, short training symbols, long training symbols, and pilots are inserted at specific locations to aid reception. These are fixed across all packets and thus, enter the IFFT using a different path in this embodiment. The IFFT essentially converts the frequency domain data into a time domain waveform. Block 1124 contains upsampling and FIR filtering to increase the sampling rate and filter out added images as described above. The Digital-to-Analog converter (DAC) 1127 converts the transmit waveform to an analog signal which leaves the chip and is then filtered by the low-pass discrete filter 1131 (which is on the board 1130) to remove images at the sampling frequency and above. Lastly, the baseband signal travels to the analog chip 1140 where it is mixed to the correct band and transmitted.

By utilizing circular filtering and or optimized circular filtering in the transmitter described above, reduced hardware, power dissipation and latency can result. While the reductions in hardware complexity and power dissipation are similar to the receiver case, the latency effects take on a different importance. Reduced latency allows different system optimizations and includes a reduction in the time between the start of the transmission process and when the transmission physically occurs.

Figure 1:
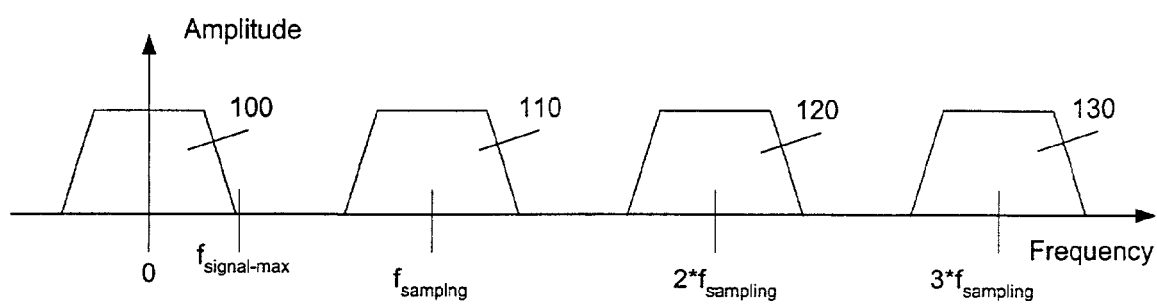
FIG. 1 illustrates the frequency spectrum of a baseband signal that exhibits no aliasing in its images.
Figure 2A:
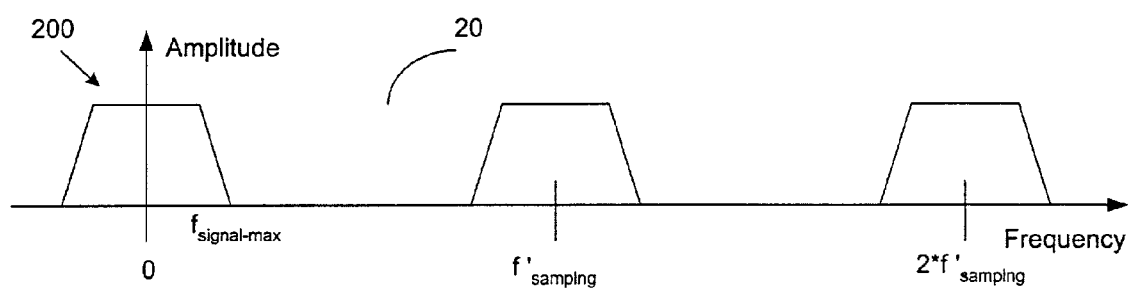
FIG. 2(a) is an example of a digital signal with a large guard band.
Figure 2B:
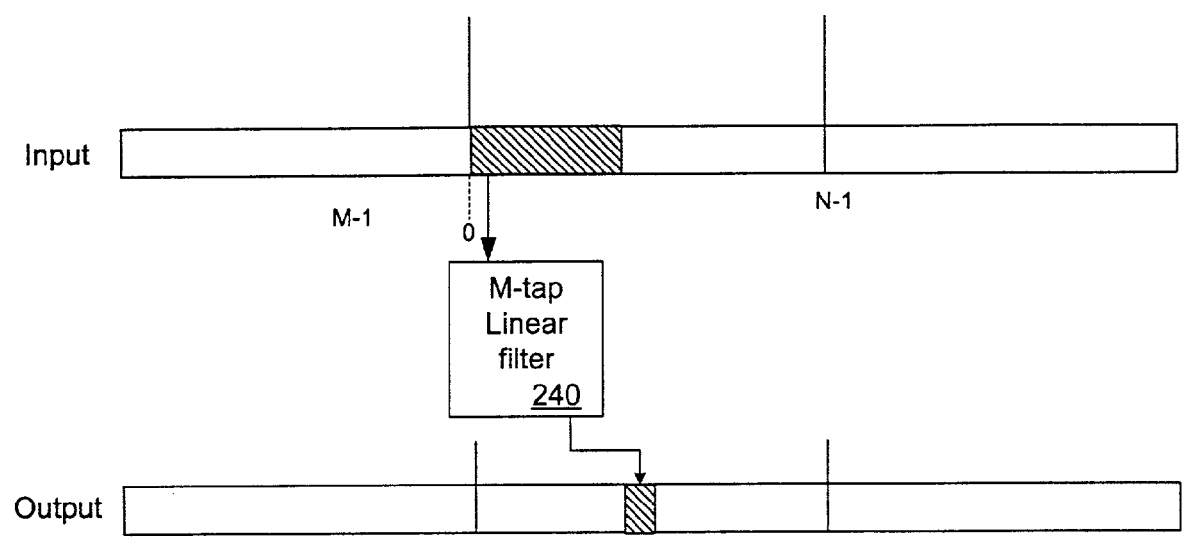
FIG. 2(b) is an example of a conventional linear filter.
Figure 3A:
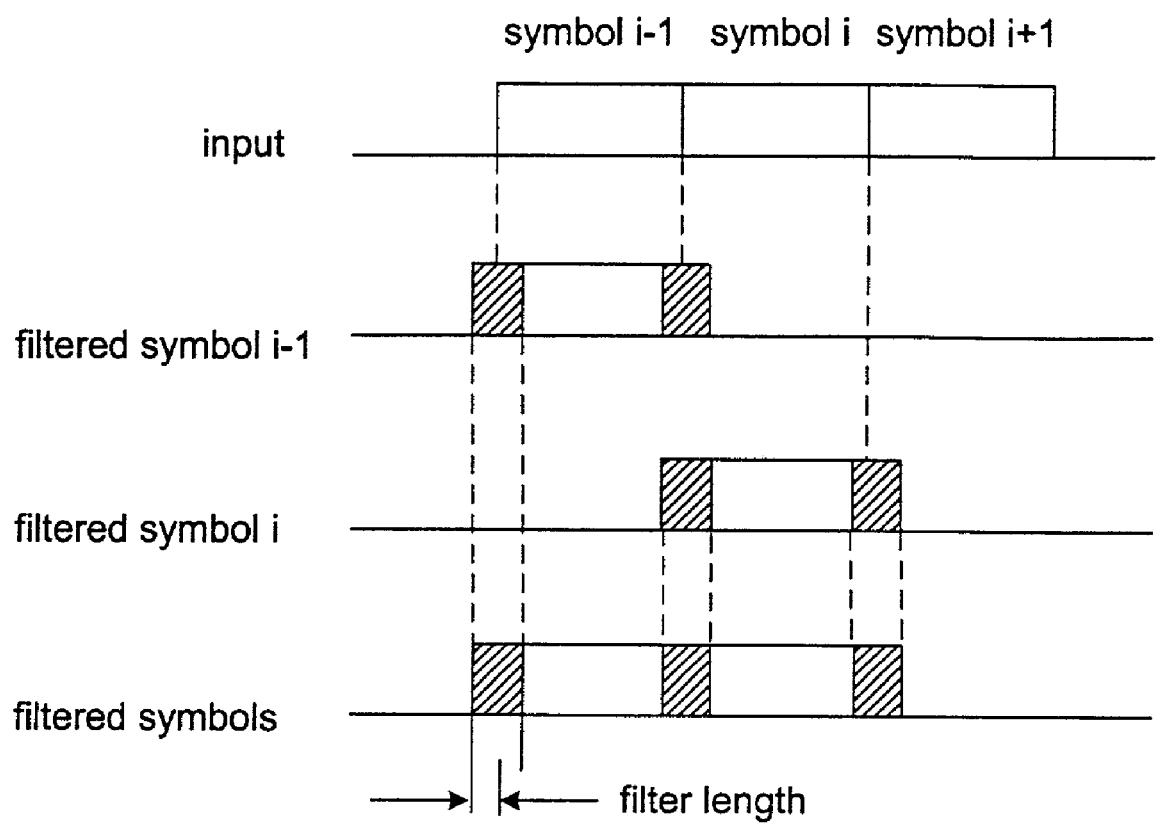
FIG. 3(a) illustrates the problem of inter-symbol interference due to a filtering operation.
Figure 3B:
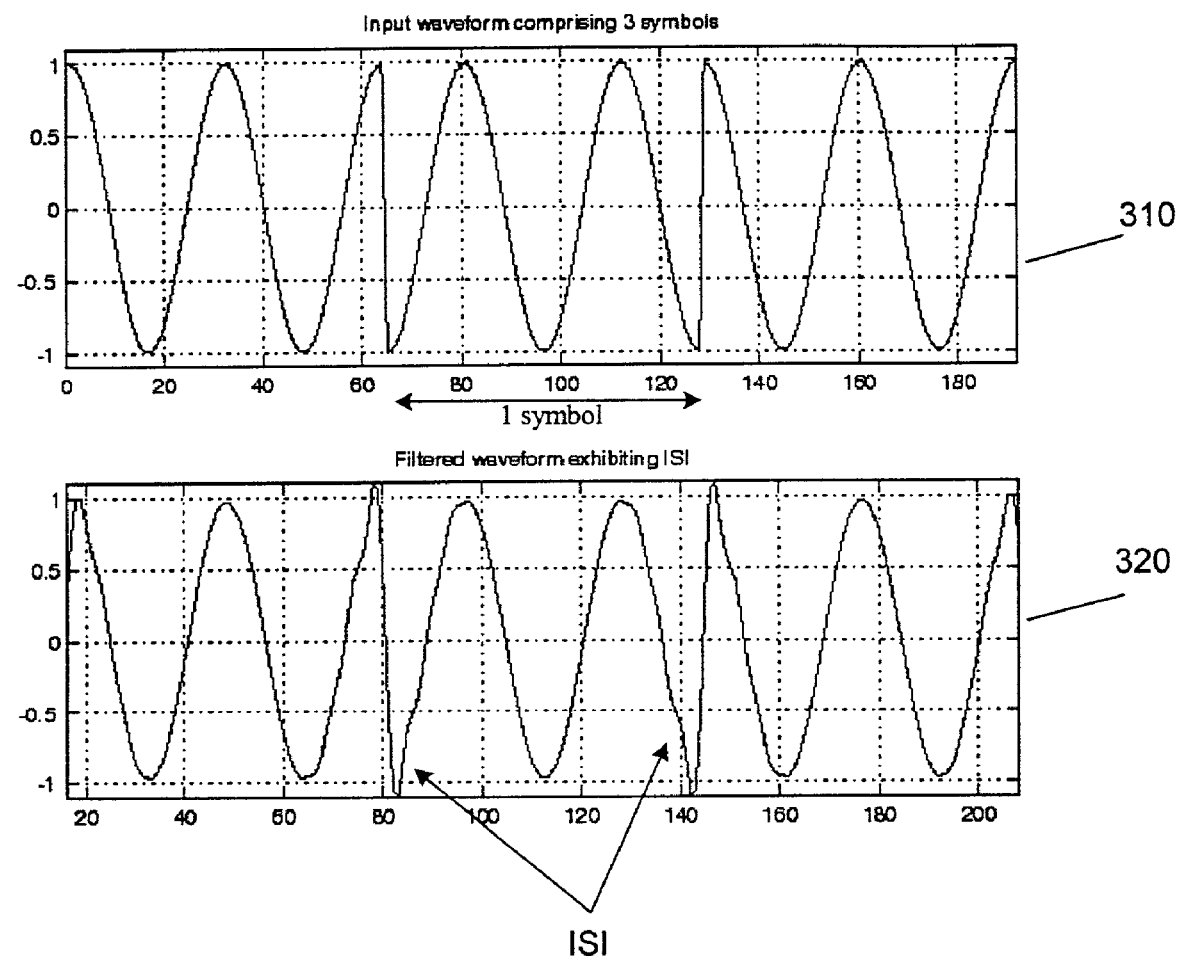
FIG. 3(b) illustrates the results of a simulation of inter-symbol interference due to a filtering operation.
Figure 4:
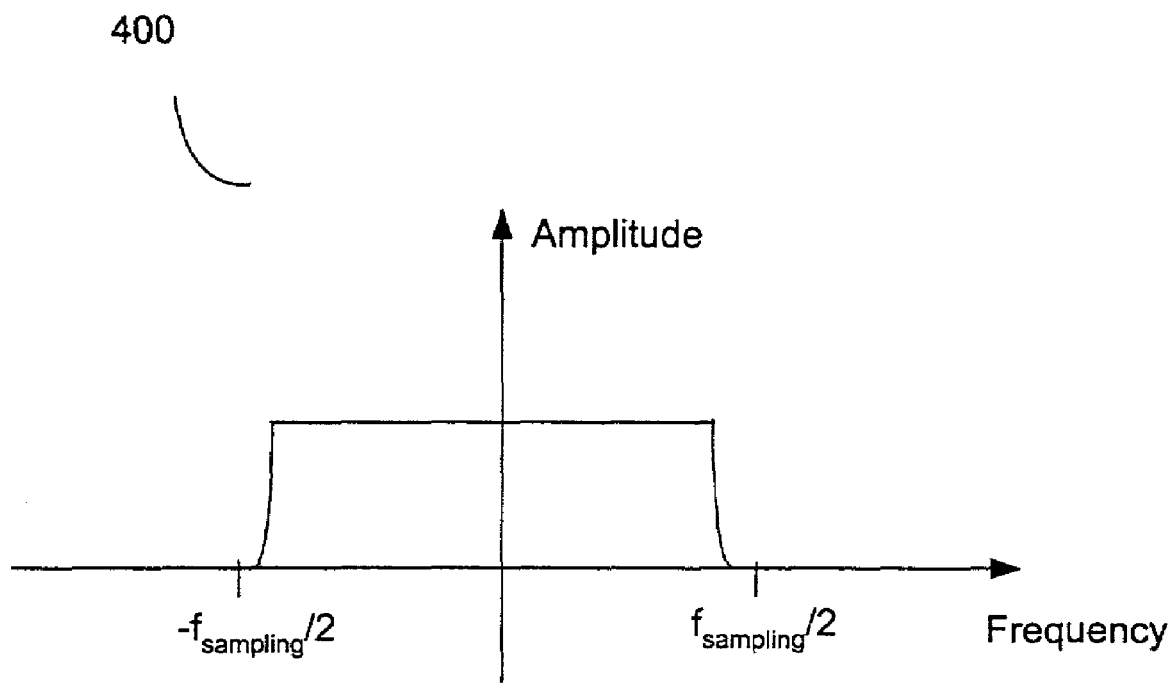
FIG. 4 illustrates an exemplary digital low-pass filter that can used in up-sampling of a signal.
Figure 5:
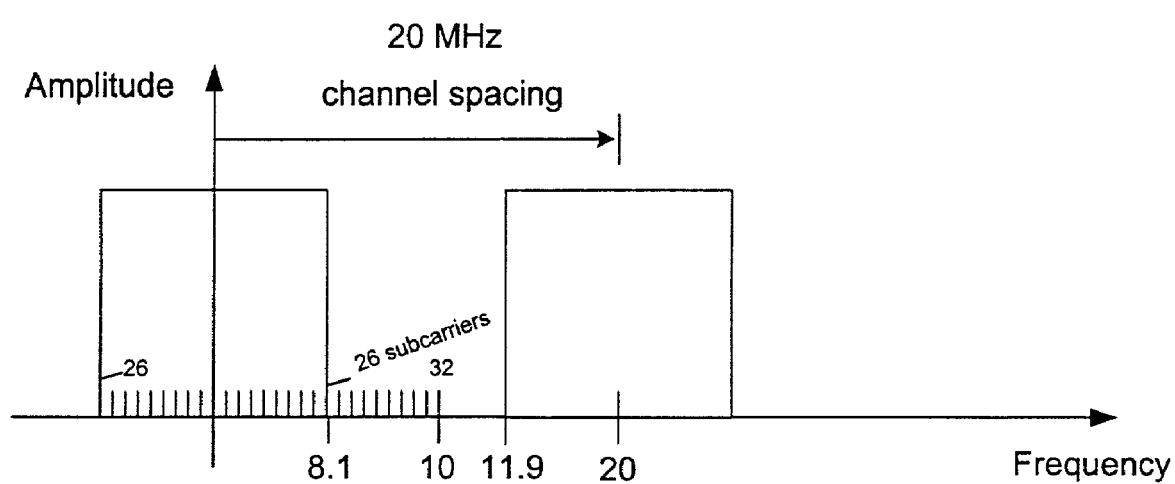
FIG. 5 shows a spectrum of a typical multi-channel communications medium with 20 MHz channels.
Figure 6:
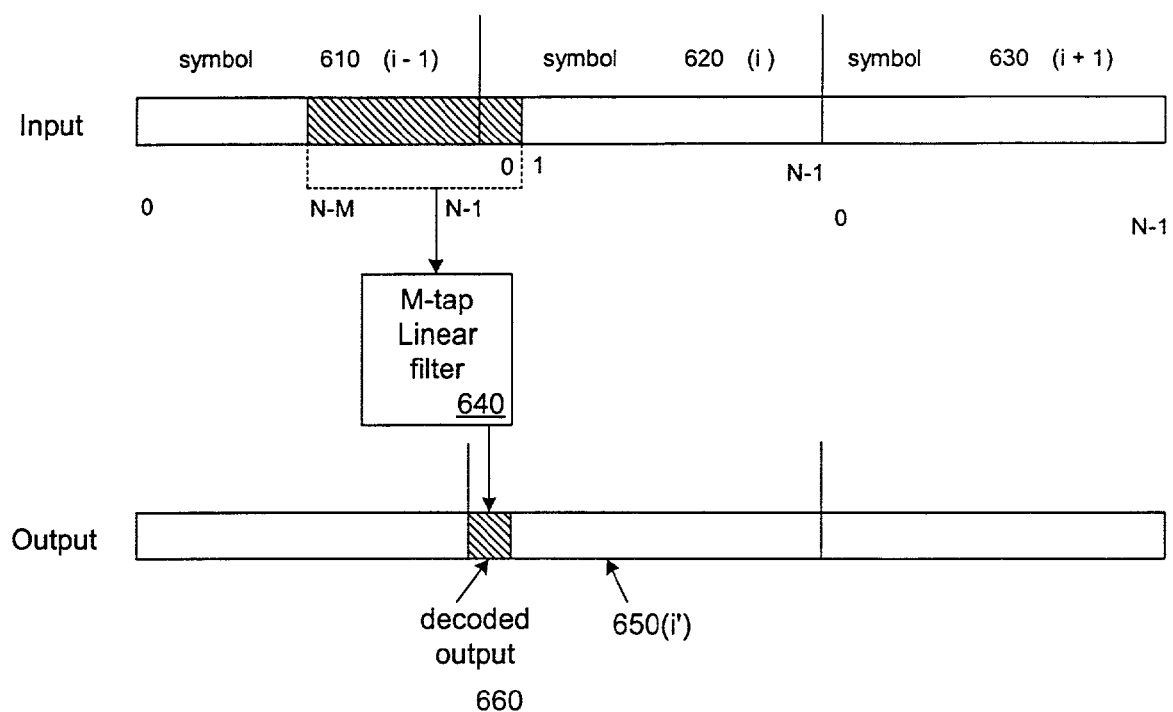
FIG. 6 illustrates the filtering of an input symbol stream using conventional linear filtering which produces inter-symbol interference.
Figure 12:
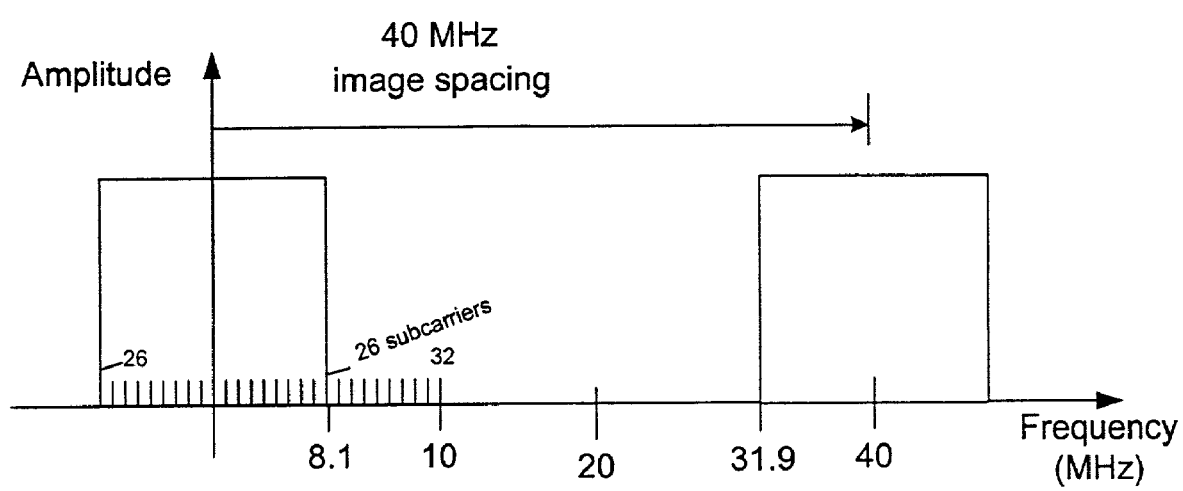
FIG. 12 illustrates another aspect of the invention which deals with the Fast Fourier Transform employed in OFDM modulated systems.

FIG. 12 illustrates another aspect of the invention which deals with the Fast Fourier Transform employed in OFDM modulated systems. As described above with respect to FIG. 5, a conventional FFT/IFFT is employed in OFDM modulated systems to perform signal synthesis/analysis. In such cases, the typical FFT/IFFT transform length is the minimum length which is convenient to give the desired frequency resolution in the channel bandwidth. A longer FFT length increases the compute power required to perform the transform or its inverse. The frequency resolution per FFT "bin" is equal to the sampling frequency divided by the length N of the FFT. Thus N=sampling frequency/frequency resolution per bin. As described above, in wireless multi-channel communications systems, in the emerging IEEE (The Institute of Electrical and Electronic Engineers) 802.11a, the sampling frequency and image spacing is 20 MHz (MegaHertz) and the subcarrier spacing is 312.5 KHz (KiloHertz). The subcarrier spacing can be equated to the frequency resolution per bin for an FFT. Thus, ordinarily, only an FFT length of $N=(20*10^6/312.5*10^3)=64$ would be used. Referring back to FIG. 5, the guard band is 3.8 MHz.

However, in accordance with the invention, the length of the FFT is artificially increased in order to increase the guard band between images. Since the number of carriers is fixed by standards, for example in the IEEE 802.11a case, a change in the FFT length would create a change in the sampling frequency, i.e. the image spacing. By increasing the FFT length from 64 to 128, for example, in the 802.11a case discussed above, the sampling frequency is increased by a factor of two, and is thus 40 MHz. This increases the guard band to 23.8 MHz. While artificially increasing the FFT length increases the guard band it also increases the computational complexity of performing the FFT. The computational complexity of an FFT of length K is known to be $K*\log(K)$. If the length of the transform is increased by a factor of L, then the increase in computational complexity would be $L*K*\log(L*K)/K*\log(K)$ or $L*\log(L*K)/\log(K)$. While the length of the increase in transform length can theoretically be any desired number, it would be easier for implementing of the FFT/IFFT if the transform lengths were powers of 2 or multiples thereof. For 802.11a systems, lengths of 128 or greater (e.g. 256, 512) would be preferable. The longer the length of the transform, the higher the sampling frequency and thus, the greater the guard band without inter-symbol interference.

Although the present invention has been described in detail with reference to the disclosed embodiments thereof, those skilled in the art will appreciate that various substitutions and modifications can be made to the examples described herein while remaining within the spirit and scope of the invention as defined in the appended claims.

What is claimed is:

1. An apparatus for filterng a series of concatenated sub-sequences of data, comprising:
    a buffer memory configured to accept as input N samples of a given one of said sub-sequences and output only a portion of said N samples on a given cycle; and
    a filter having M taps, the output of said buffer memory coupled to an input of said filter, said buffer memory configured to input to said filter only samples of said given one sub-sequence, said filter configured to provide output samples that are filtered versions of only input samples from the same said given one sub-sequence,
    wherein an Rth output sample of said given one sub-sequence, if R is less than M, is a filtered version of the last M−R samples of said given one sub-sequence and the first R samples of said given one sub-sequence.

2. An apparatus according to claim 1 wherein each one of said sub-sequences encodes a symbol.

3. An apparatus according to claim 1 wherein said sub-sequences are discrete in nature.

4. An apparatus according to claim 1 wherein said filter is a linear filter.

5. An apparatus according to claim 1 wherein said series of concatenated sub-sequences comprise a digital baseband signal.

6. An apparatus according to claim 4 wherein said filter is a digital filter.

7. An apparatus according to claim 1 wherein all said output samples exhibit no interference from input samples of said sub-sequences other than the sub-sequence which is represented by said output samples.

8. An apparatus according to claim 1 wherein said apparatus is deployed in a multi-channel communications system.

9. An apparatus according to claim 8 wherein said system utilizes orthogonal frequency division multiplexing.

10. An apparatus according to claim 1 wherein said buffer memory is read to provide said filter input for a given one sub-sequence as soon as input sample N−M is written to said buffer memory.

11. An apparatus according to claim 10 wherein a latency for providing a first output sample of a given one sub-sequence is proportional to the time required to write all N samples to said buffer memory.

12. An apparatus according to claim 1 wherein the Rth output sample of said given one sub-sequenre, if R is not less than M, is a filtered version of the Rth input sample and the previous M−1 input samples of said given one sub-sequence.

13. An apparatus according to claim 1 wherein M is less than N.

14. A method of filtering a series of concatenated sub-sequences of data, comprising:
buffering N samples of a given one said sub-sequences;
providing as input to a filter of M taps only samples from said given one sub-sequence; and
filtering using said filter said samples input thereto, said filtering generating output samples which are a function of only samples from said given one sub-sequence,
wherein for an Rth output sample of said given one sub-sequence:
if R is less than N, then providing as input to said filter the last M−R samples of said given one sub-sequence and the first R samples of said given one sub-sequence; and
if R is not less than M, then providing as input to said filter the Rth sample and the M−1 samples of said given one sub-sequence preceding the Rth sample.

15. A method according to claim 14 wherein said providing as input commences as soon as N−M samples have been buffered.

16. A method according to claim 14 wherein each said sub-sequence encodes a symbol.

17. A method according to claim 14 wherein said filtering is digital filtering.

18. A method according to claim 16 wherein said symbol is carried on a orthogonal frequency division multiplexing system.

19. A method according to claim 14 wherein a latency for providing a first output sample of a given one sub-sequence is proportional to the time required to buffer all N samples.

20. A method according to claim 14 further comprising:
reading the buffered samples to provide said filter input for a given one sub-sequence as soon as input sample N−M is buffered.

21. A method according to claim 14 wherein all said output samples exhibit no interference from input samples of said sub-sequences other than the sub-sequence which is represented by said output samples.

22. A method according to claim 14 wherein M is less than N.

23. An apparatus for filtering a series of concatenated sub-sequences of data, each sub-sequence having N samples indexed from 0 to N−1, said apparatus comprising:
a buffer memory configured to accept as input M samples of a given one of said sub-sequences;
a multiplexer configured to select as its output one of an output of said buffer and an unbuffered sample of said given one sub-sequence as it is streamed to said apparatus;
and a filter having M taps, the output of said multiplexer coupled to the input of said filter, said apparatus providing as output samples of said given one sub-sequence a filtered version of input samples only from the same said given one sub-sequence,
wherein the Rth output sample for said given one sub-sequence, if R is less than M, is a filtered version of the last M−R samples of said given one sub-sequence and the first R samples of said given one sub-sequence.

24. An apparatus according to claim 23 wherein each one of said sub-sequences encodes a symbol.

25. An apparatus according to claim 23 wherein said sub-sequences are discrete in nature.

26. An apparatus according to claim 23 wherein said filter is a linear filter.

27. An apparatus according to claim 23 wherein said series of concatenated sub-sequences comprise a digital baseband signal.

28. An apparatus according to claim 26 wherein said filter is a digital filter.

29. An apparatus according to claim 23 wherein all said output samples exhibit no interference from input samples of said sub-sequences other than the sub-sequence which is represented by said output samples.

30. An apparatus according to claim 23 wherein said apparatus is deployed in a multi-channel communications system.

31. An apparatus according to claim 30 wherein said system utilizes orthogonal frequency division multiplexing.

32. An apparatus according to claim 23 wherein said multiplexer is ready to provide a complete M input samples to said filter input for a given one sub-sequence when the first M input samples are first streamed.

33. An apparatus according to claim 32 wherein a latency for providing a first output sample of a given one sub-sequence is proportional to the time required to write all M samples to said buffer memory.

34. An apparatus according to claim 23 wherein the Rth output sample of said given one sub-sequence, if R is not less than M, is a filtered version of the Rth input sample and the previous M−1 input samples of said given one sub-sequence.

35. An apparatus according to claim 32 wherein said multiplexer selects the unbuffered input samples of said given one sub-sequence being streamed until all N input samples have been streamed.

36. An apparatus according to claim 35 wherein said multiplexer selects input samples stored in said buffer memory after said N samples have been streamed into said apparatus.

37. An apparatus according to claim 36 wherein the first N−M output samples observed at the output of said filter correspond to the last N−M samples of said given one sub-sequence.

38. An apparatus according to claim 37 wherein the last M samples observed at the output of said filter correspond to the first M samples of said given one sub-sequence.

39. An apparatus according to claim 37 wherein said sub-sequences are tolerant to a fixed phase modification.

40. An apparatus according to claim 23 wherein M is less than N.

41. A method of filtering a series of concatenated sub-sequences of data, each sub-sequence consisting N samples indexed from 0 to N−1 said method comprising:

buffering M samples of a given one of said sub-sequences;

providing as input to a filter one of said buffered M samples and an unbuffered input sample of said given one sub-sequence;

filtering using said filter said samples input thereto, said filtering generating output samples which are a function of only samples from said given one sub-sequence, wherein for the Rth output sample of said given one sub-sequence, said providing includes:

if R is less than M, then providing as input to said filter the last M−R samples of said given one sub-sequence and the first R samples of said given one sub-sequence; and if R is not less than M, then providing as input to filter the Rth sample and the M−1 samples of said given one sub-sequence preceding the Rth sample.

42. A method according to claim 41 wherein said providing as input commences as soon the first input sample is streamed into an apparatus.

43. A method according to claim 41 wherein each said sub-sequence encodes a symbol.

44. A method according to claim 41 wherein said filtering is digital filtering.

45. A method according to claim 43 wherein said symbols are carried on a orthogonal frequency division multiplexing system.

46. A method according to claim 41 wherein a latency for providing a first output sample of a given one sub-sequence is proportional to the time required to buffer M input samples.

47. A method according to claim 41 further wherein providing includes:

selecting said unbuffered input samples while all N samples are being streamed in; and selecting said buffered samples after all N samples have been streamed in.

48. A method according to claim 41 wherein all said output samples exhibit no interference from input samples of said sub-sequences other than the sub-sequence which is represented by said output samples.

49. A method according to claim 47 wherein the first N−M output samples observed at the output of said filter correspond to the last N−M samples of said given one sub-sequence.

50. A method according to claim 49 wherein the last M samples observed at the output of said filter correspond to the first M samples of said given one sub-sequence.

51. A method according to claim 49 wherein said sub-sequences are tolerant to a fixed phase modification.

52. A method according to claim 41 wherein M is less than N.

* * * * *